United States Patent
Woo et al.

(10) Patent No.: US 10,923,179 B2
(45) Date of Patent: Feb. 16, 2021

(54) MEMORY DEVICE AND OPERATING METHOD THEREOF

(71) Applicant: SK hynix Inc., Icheon-si (KR)

(72) Inventors: Young Jin Woo, Cheongju-si (KR); Won Yeol Choi, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/591,725

(22) Filed: Oct. 3, 2019

(65) Prior Publication Data
US 2020/0286542 A1    Sep. 10, 2020

(30) Foreign Application Priority Data

Mar. 5, 2019    (KR) .................... 10-2019-0025345

(51) Int. Cl.
| | | |
|---|---|---|
| *G11C 16/10* | (2006.01) | |
| *G11C 11/409* | (2006.01) | |
| *G11C 11/4074* | (2006.01) | |
| *G11C 29/24* | (2006.01) | |
| *G11C 29/38* | (2006.01) | |
| *G11C 11/408* | (2006.01) | |
| G11C 29/12 | (2006.01) | |

(52) U.S. Cl.
CPC ........ *G11C 11/409* (2013.01); *G11C 11/4074* (2013.01); *G11C 11/4085* (2013.01); *G11C 29/24* (2013.01); *G11C 29/38* (2013.01); *G11C 2029/1202* (2013.01)

(58) Field of Classification Search
CPC .............. G11C 11/409; G11C 11/4074; G11C 11/4085; G11C 29/38
USPC ..................................................... 365/185.22
See application file for complete search history.

(56) References Cited

U.S. PATENT DOCUMENTS

2016/0064084 A1* 3/2016 Lu ..................... G11C 11/5628
365/185.19

FOREIGN PATENT DOCUMENTS

| KR | 1020100013962 A | 2/2010 |
|---|---|---|
| KR | 1020170047655 A | 5/2017 |

* cited by examiner

*Primary Examiner* — Xiaochun L Chen
(74) *Attorney, Agent, or Firm* — William Park & Associates Ltd.

(57) ABSTRACT

A memory device includes a page with plurality of memory cells and a peripheral circuit that performs at least one program loop. The at least one program loop includes a program voltage applying phase for applying, during a program operation, a program voltage to a word line to which the plurality of memory cells are coupled and a program verify phase for determining whether a selected memory cell among the plurality of memory cells has been completely programmed. The memory device includes control logic that controls the peripheral circuit to: perform an auxiliary verify operation of applying an auxiliary verify voltage to the word line; perform a main verify operation of applying a main verify voltage larger than the auxiliary verify voltage to the word line; and determine a fail of the program operation, based on verify data obtained by performing the auxiliary verify operation and the main verify operation.

20 Claims, 15 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2019-0025345, filed on Mar. 5, 2019, the entire disclosure of which is incorporated herein by reference in its entirety.

BACKGROUND

1. Technical Field

The present disclosure generally relates to an electronic device, and more particularly, to a memory device and an operating method thereof.

2. Related Art

A storage device is a device configured to store data under the control of a host device such as a computer, a smart phone or a smart pad. The storage device includes a device configured to store data on a magnetic disk, such as a Hard Disk Drive (HDD), and a device configured to store data in a semiconductor memory, i.e., a nonvolatile memory, such as a Solid State Drive (SSD) or a memory card.

The storage device may include a memory device configured to store data and a memory controller configured to control the memory device. Memory devices are classified into volatile memory devices and nonvolatile memory devices. A nonvolatile memory device may be a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Embodiments provide a memory device configured to process a program operation as fail in a program verify phase so as to prevent uncorrectable ECC (UECC) fail, and an operating method of the memory device.

In accordance with an aspect of the present disclosure, a memory device includes a page having a plurality of memory cells and a peripheral circuit configured to perform at least one program loop. The at least one program loop includes a program voltage applying phase for applying, during a program operation, a program voltage to a word line to which the plurality of memory cells are coupled and a program verify phase for determining whether a selected memory cell among the plurality of memory cells has been completely programmed. The memory device also includes control logic configured to control the peripheral circuit to: perform, during the program verify phase, an auxiliary verify operation of applying an auxiliary verify voltage to the word line; perform, during the program verify phase, a main verify operation of applying a main verify voltage larger than the auxiliary verify voltage to the word line; and determine a fail of the program operation, based on verify data obtained by performing the auxiliary verify operation and the main verify operation.

In accordance with another aspect of the present disclosure, a method for operating a memory device having a plurality of pages includes performing at least one program loop including a program voltage applying phase for applying, during a program operation, a program voltage to a word line to which a plurality of memory cells are coupled and a program verify phase for determining whether a selected memory cell among the plurality of memory cells has been completely programmed. The method also includes performing, during the program verify phase, an auxiliary verify operation of applying an auxiliary verify voltage to the word line and performing, during the program verify phase, a main verify operation of applying a main verify voltage larger than the auxiliary verify voltage to the word line. The method further includes determining a fail of the program operation, based on verify data obtained by performing the auxiliary verify operation and the main verify operation.

BRIEF DESCRIPTION OF THE DRAWINGS

Example embodiments are described in detail hereinafter with reference to the accompanying drawings; however, they may be embodied in different forms and should not be construed as limited to the embodiments set forth herein. Rather, these embodiments are provided so that this disclosure will be enabling to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout the written description.

DETAILED DESCRIPTION

Figure 1:
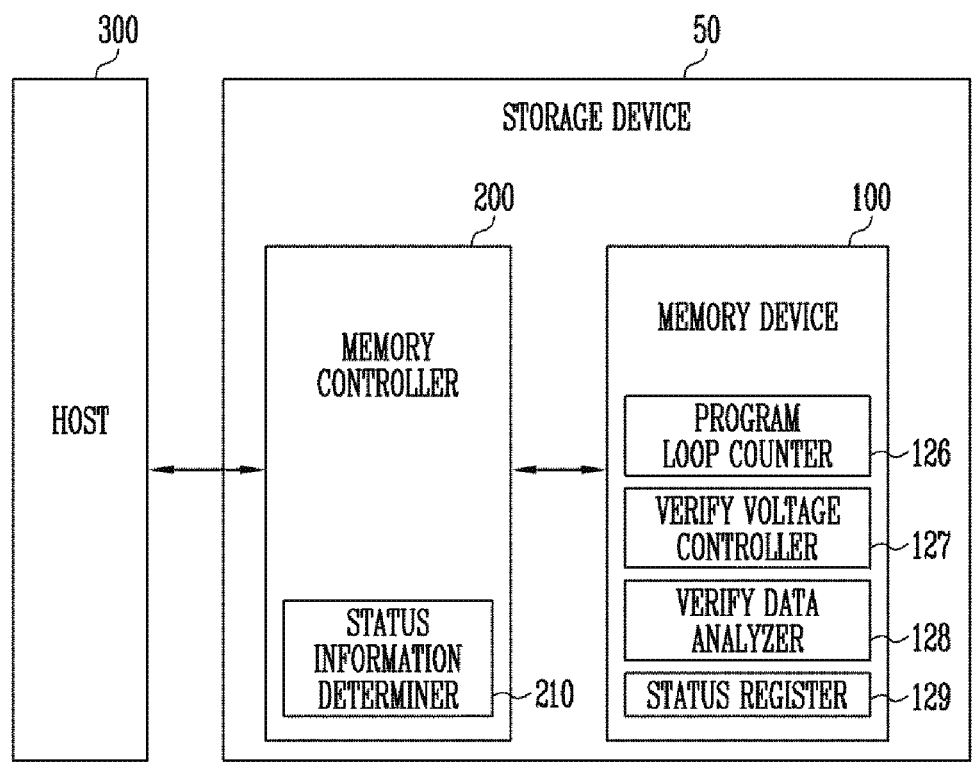
FIG. 1 is a block diagram illustrating a storage device.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~between," "immediately~between" or "adjacent to~" and "directly adjacent to~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, embodiments of the present disclosure will be described in detail with reference to the accompanying drawings in order for those skilled in the art to be able to readily implement the technical spirit of the present disclosure.

FIG. 1 is a block diagram illustrating a storage device.

Referring to FIG. 1, the storage device 50 may include a memory device 100, a memory controller 200, and a buffer memory (not shown).

The storage device 50 may be a device for storing data under the control of a host 300, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host 300. For example, the storage device 50 may be implemented with any one of various types of storage devices, such as a Multi-Media Card (MMC) of a Solid State Drive (SSD), an embedded Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Serial Bus (USB) storage device, a Universal Flash Storage (UFS) device, a storage device of a Personal Computer Memory Card International Association (PCMCIA) card type, a storage device of a Peripheral Component Interconnection (PCI) card type, a storage device of a PCI-Express (PCI-E) card type, a Compact Flash (CF) card, a smart media card, and a memory stick.

The storage device 50 may be manufactured as any one of various kinds of package types. For example, the storage device 50 may be manufactured as any one of various kinds of package types, such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of planes. Each plane may include a plurality of memory blocks BLK1 to BLKz. Each memory block may include a plurality of memory cells. One memory block may include a plurality of pages. In an embodiment, the page may be a unit for storing data in the memory device 100 or reading data stored in the memory device 100. The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

In an embodiment, the memory device 100 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, each of the memory cells included in the memory device 100 may be configured as a Single-Level Cell (SLC) for storing one data bit. Also, each of the memory cells included in the memory device 100 may be configured as a Multi-Level Cell (MLC) for storing two data bits, a Triple-Level Cell (TLC) for storing three data bits, or a Quad-Level Cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory device 100 may include a program loop counter 126. The program loop counter 126 may count a number of program loops performed in a page to be programmed among a plurality of pages included in the memory device 100. Each of the plurality of pages may include a plurality of memory cells. The program loop may include a program voltage applying phase for applying a program voltage to a word line to which a plurality of memory cells are coupled and a program verify phase for determining whether a selected memory cell among the plurality of memory cells has been completely programmed.

That is, the program loop counter 126 may count a number of times at least one program loop including the program voltage applying phase and the program verify phase is performed. The program loop counter 126 may generate a program loop count value PL_COUNT obtained by counting a number of at least one program loop performed in a page including a plurality of memory cells.

The memory device 100 may include a verify voltage controller 127. The verify voltage controller 127 may control a verify voltage VFY_VOL, based on the program loop count value PL_COUNT counted by the program loop counter 126. Specifically, the verify voltage controller 127 may control the verify voltage VFY_VOL in the program verify phase included in the program loop. The verify voltage controller 127 may control a level of the verify voltage VFY_VOL and a number of times the verify voltage VFY_VOL is applied according to whether the program loop count value PL_COUNT exceeds a reference value.

The memory device 100 may include a verify data analyzer 128. The verify data analyzer 128 may receive verify data VFY_DATA generated based on a verify operation performed in the program verify phase included in the program loop. The verify data analyzer 128 may generate a verify result VFY_RST, based on the verify data VFY_DATA. The verify data VFY_DATA may include data about a number of turned-on or turned-off memory cells in the program verify phase. In addition, the verify result VFY_RST may include information representing the pass or fail of a program operation and information representing that the pass or fail of the program operation has been determined by the verify operation. Therefore, the verify data analyzer 128 may determine the pass or fail of the program operation, based on the verify data VFY_DATA.

The memory device 100 may include a status register 129. The status register 129 may store status information Status Information. The status information Status Information may include information representing the pass or fail of a program operation. Further, the status information Status Information may include information representing that the pass or fail of the program operation has been determined without performing all predetermined program loops. The status information Status Information stored in the status register 129 may be output to the memory controller 200 in response to a status read command.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. Also, the memory controller 200 may store, in the buffer memory, logical-physical address mapping information that establishes a mapping relationship between the LBA and the PBA.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands executed by the memory controller 200. Alternatively, the buffer memory may store data processed by the memory controller 200.

In an embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the storage device 50 might not include the buffer memory. Therefore, volatile memory devices 100 external to the storage device 50 may perform functions of the buffer memory.

In an embodiment, the memory controller 200 may control at least two memory devices 100. The memory controller 200 may control the memory devices according to an interleaving scheme so as to improve operational performance.

The memory controller may include a status information determiner 210. The status information determiner 210 may output a status read command to the memory device 100 so as to determine the pass or fail of an operation performed by the memory device 100. The status information determiner 210 may determine the pass or fail of the operation performed by the memory device 100 by receiving status information Status Information stored in the status register 129. The status information determiner 210 may determine, based on the status information Status Information, that a program operation has been processed as fail even when the memory device 100 did not completely perform a predetermined program loop.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
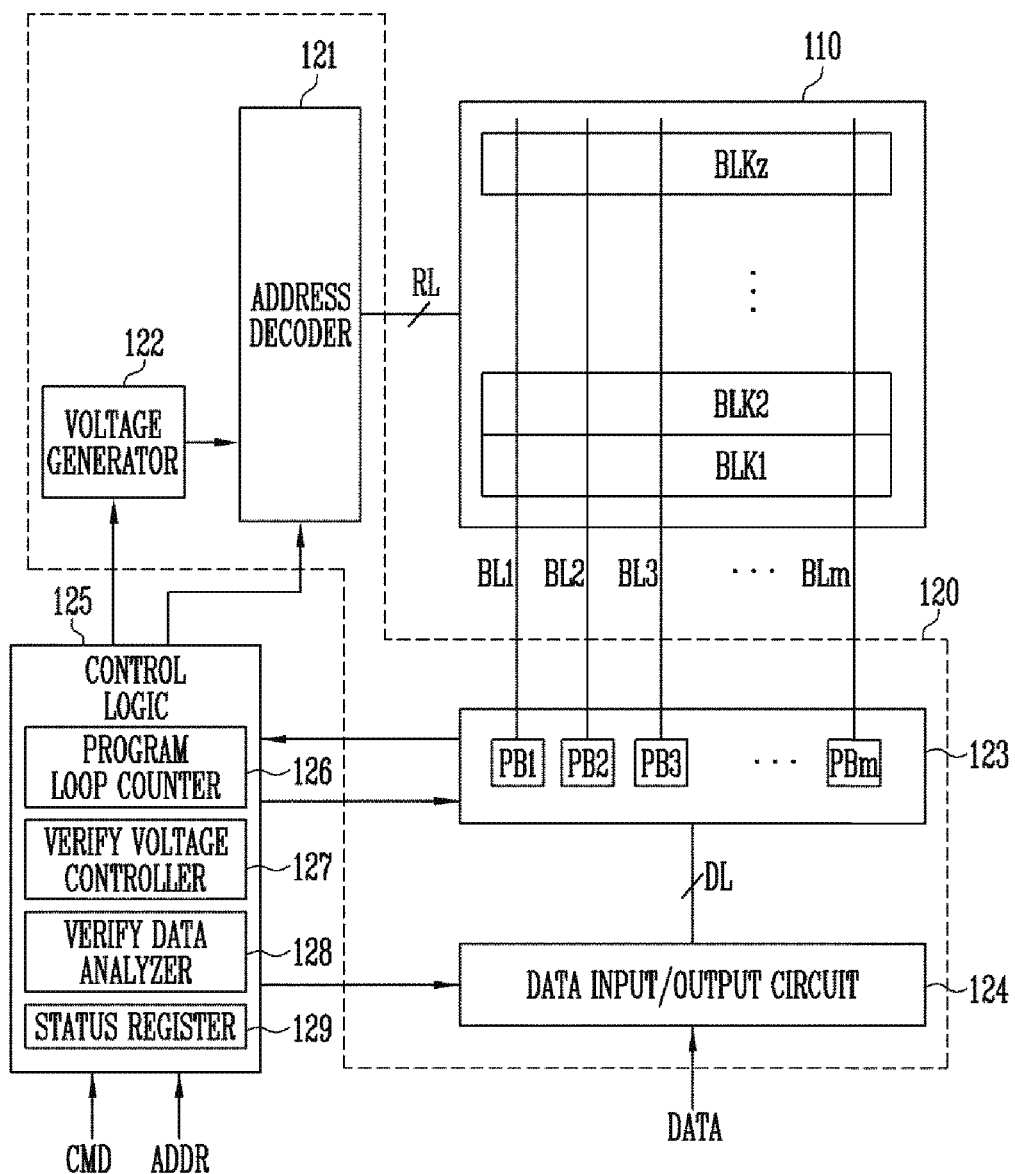
FIG. 2 is a block diagram illustrating a structure of a memory device shown in FIG. 1.

FIG. 2 is a block diagram illustrating, in accordance with an embodiment, a structure of the memory device 100 shown in FIG. 1.

Referring to FIG. 2, the memory device 100 includes a memory cell array 110, a peripheral circuit 120, and control logic 125. The control logic 125 may be implemented as hardware, software, or a combination of hardware and software. For example, the control logic 125 may be a control logic circuit and/or a processor executing control logic code.

The memory cell array 110 may include a plurality of memory blocks BLK1 to BLKz. The plurality of memory blocks BLK1 to BLKz are coupled to an address decoder 121 through row lines RL, and are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells.

A plurality of memory cells included in the memory cell array may be divided into a plurality of blocks according to usage thereof. System information as various setting information necessary to control the memory device 100 may be stored in the plurality of blocks.

Each of first to zth memory blocks BLK1 to BLKz includes a plurality of cell strings. First to mth cell strings are coupled to first to mth bit lines BL1 to BLm, respectively. Each of the first to mth cell strings includes a drain select transistor, a plurality of memory cells coupled in series, and a source select transistor. The drain select transistor is coupled to a drain select line. First to nth memory cells are coupled to first to nth word lines. The source select transistor is coupled to a source select line. A drain side of the drain select transistor is coupled to a corresponding bit line. The drain select transistors of the first to mth cell strings are coupled to the first to mth bit lines BL1 to BLm, respectively. A source side of the source select transistor is coupled to a common source line. In an embodiment, the common source line may be commonly coupled to the first to zth memory blocks BLK1 to BLKz. The drain select line DSL, the first to nth word lines, and the source select line are included in the row lines RL. The drain select line DSL, the first to nth word lines, and the source select line are controlled by the address decoder 121. The common source line is controlled by the control logic 125. The first to mth bit lines BL1 to BLm are controlled by the read/write circuit 123.

The peripheral circuit 120 includes the address decoder 121, a voltage generator 122, the read/write circuit 123, and a data input/output circuit 124.

The address decoder 121 is coupled to the memory cell array 110 through the row lines RL. The address decoder 121 is configured to operate under the control of the control logic 125. The address decoder 121 receives an address ADDR through the control logic 125.

In an embodiment, a program operation and a read operation of the memory device 100 are performed in units of pages.

In the program and read operations, the address ADDR received by the control logic 125 may include a block address and a row address. The address decoder 121 is configured to decode the block address in the received address ADDR. The address decoder 121 selects one memory block among the memory blocks BLK1 to BLKz according to the decoded block address.

The address decoder 121 is configured to decode the row address in the received address ADDR. The address decoder 121 selects one word line of a selected memory block by applying voltages provided from the voltage generator 122 to the row lines RL according to the decoded row address.

In an erase operation, the address ADDR includes a block address. The address decoder 121 decodes the block address, and selects one memory block according to the decoded block address. The erase operation may be performed on the whole or a portion of the one memory block.

In a partial erase operation, the address ADDR may include block and row addresses. The address decoder 121 selects one memory block among the memory blocks BLK1 to BLKz according to the block address.

The address decoder 121 is configured to decode the row addresses in the received address ADDR. The address decoder 121 selects at least one word line of the selected memory block by applying voltages provided from the voltage generator 122 to the row lines RL according to the decoded row addresses.

In an embodiment, the address decoder 121 may include a block decoder, a word line decoder, an address buffer, and the like.

The voltage generator 122 generates a plurality of voltages, using an external power voltage supplied to the memory device 100. The voltage generator 122 operates under the control of the control logic 125.

In an embodiment, the voltage generator 122 may generate an internal power voltage by regulating the external power voltage. The internal power voltage generated by the voltage generator 122 is used as an operating voltage of the memory device 100.

In an embodiment, the voltage generator 122 may generate a plurality of voltages, using the external power voltage or the internal power voltage.

For example, the voltage generator 122 may include a plurality of pumping capacitors for receiving the internal power voltage, and generate a plurality of voltages by selectively activating the plurality of pumping capacitors under the control of the control logic 130. The plurality of generated voltages are applied to word lines selected by the address decoder 121.

In a program operation, the voltage generator 122 may generate a high-voltage program pulse and a pass pulse lower than the program pulse. In a read operation, the voltage generator 122 may generate a read voltage and a pass voltage higher than the read voltage. In an erase operation, the voltage generator 122 may generate an erase voltage.

The read/write circuit 123 includes first to mth page buffers PB1 to PBm. The first to mth page buffers PB1 to PBm are coupled to the memory cell array 110 respectively through the first to mth bit lines BL1 to BLm. The first to mth page buffers PB1 to PBm operate under to control of the control logic 125.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, when a program pulse is applied to a selected word line, the first to mth page buffers PB1 to PBm may transfer the data DATA received through the data input/out circuit 124 to selected memory cells through the bit lines BL1 to BLm. Memory cells of a selected page are programmed according to the transferred data DATA. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) may be maintained. In a program verify operation, the first to mth page buffers PB1 to PBm read page data from selected memory cells through the bit lines BL1 to BLm.

In a read operation, the read/write circuit 123 reads data DATA from memory cells of a selected page through the bit lines BL, and outputs the read data DATA to the data input/output circuit 124. In an erase operation, the read/write circuit 123 may float the bit lines BL.

In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 125. In a program operation, the data input/output circuit 124 receives data DATA to be stored from an external controller (not shown).

The control logic 125 is coupled to the address decoder 121, the voltage generator 122, the read/write circuit 123, and the data input/output circuit 124. The control logic 125 may control overall operations of the memory device 100. The control logic 125 receives a command CMD and an address ADDR. The control logic 125 controls the address decoder 121, the voltage generator 122, the read/write circuit 123, and the data input/output circuit 124 in response to the command CMD.

The control logic 125 may include a program loop counter 126, a verify voltage controller 127, a verify data analyzer 128, and a status register 129.

The program loop counter 126 may count a number of program loops performed in one page among a plurality of pages included in the memory device 100. The verify voltage controller 127 may control a verify number and a level a verify voltage VFY_VOL in a program verify phase, based on a program loop count value PL_COUNT obtained by counting the number of program loops. The verify data analyzer 128 may receive verify data VFY_DATA through the program verify phage, and generate a verify result VFY_RST, based on the verify data VFY_DATA. The status register 129 may store pass information or fail information Fail Information (FI) of a program operation and a set flag Flag, which are included in the verify result VFY_RST.

The program loop counter 125, the verify voltage controller 127, the verify data analyzer 128, and the status register 129, which are included in the control logic 125, will be described in more detail with reference to FIG. 6.

Figure 3:
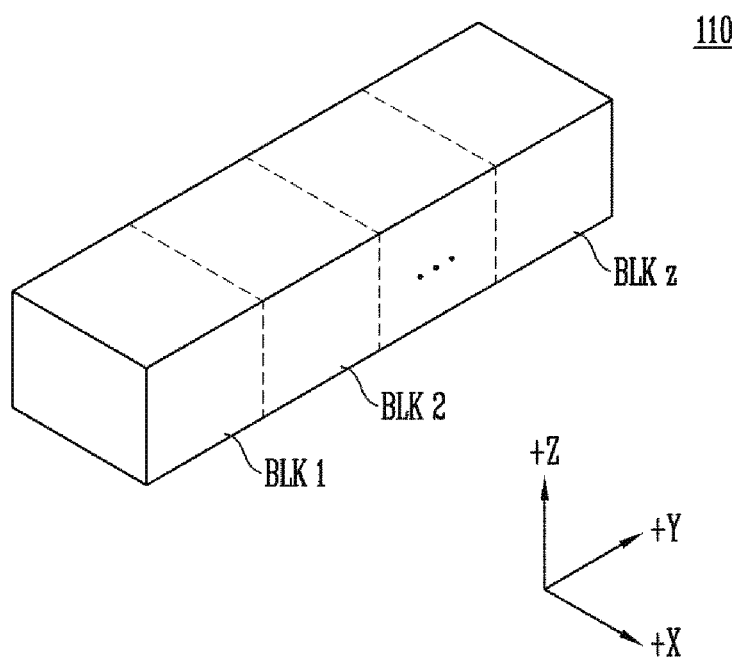
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
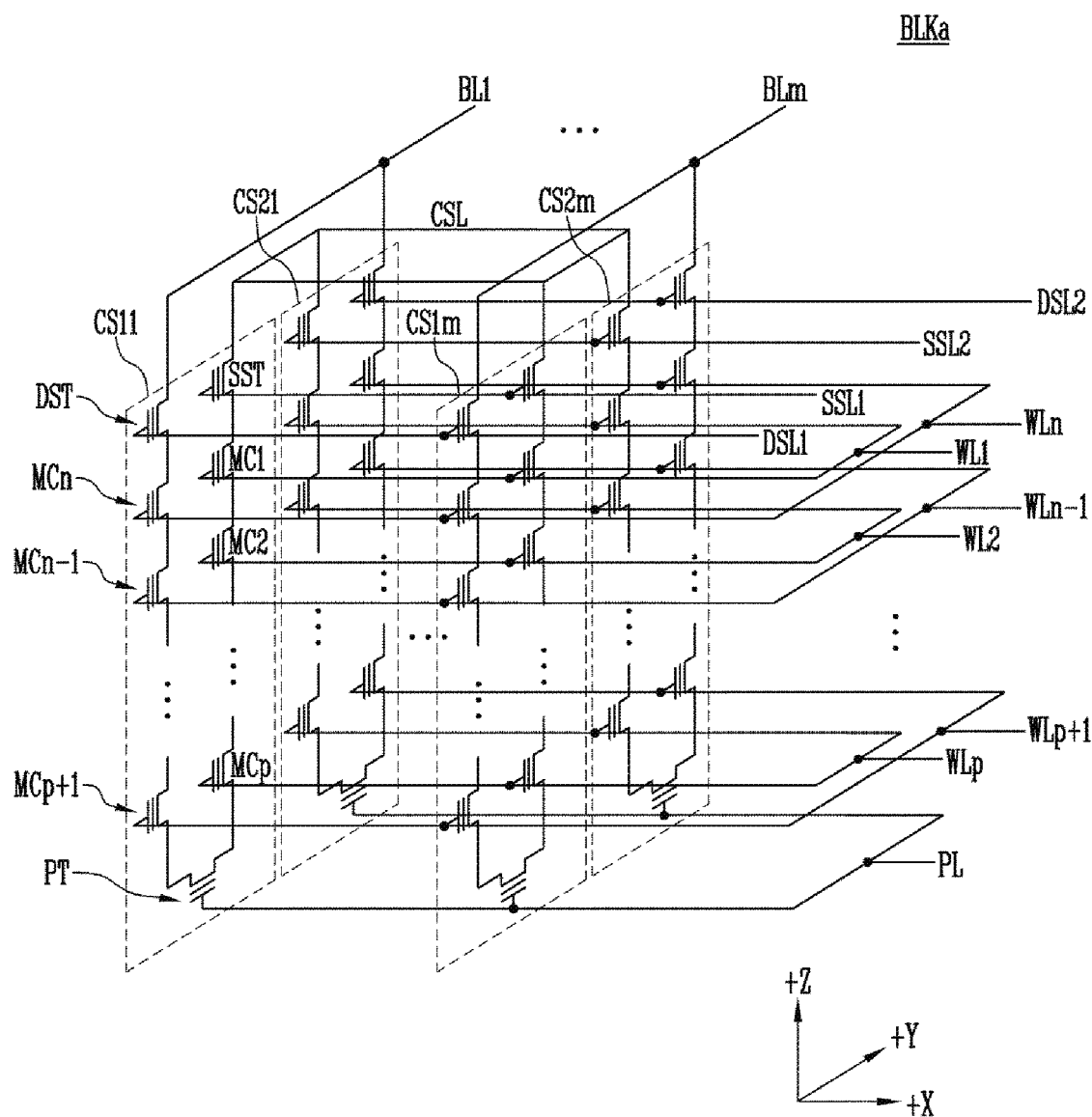
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3 in accordance with another embodiment.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1$m$ on a first row are coupled to a first source select line SSL1. The source select transistors of the cell strings CS21 to CS2$m$ on a second row are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1$m$ on the first row are coupled to a first drain select line DSL1. The drain select transistors of the cell strings CS21 to CS2$m$ on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1$m$ and CS2$m$ on an mth column are coupled to an mth bit line BLm.

Memory cells coupled to the same word line in the cell strings arranged in the row direction constitute one page. For example, memory cells coupled to the first word line WL1 in the cell strings CS11 to CS1$m$ on the first row constitute one page. Memory cells coupled to the first word line WL1 in the cell strings CS21 to CS2$m$ on the second row constitute another page. As any one of the drain select lines DSL1 and DSL2 is selected, cell strings arranged in one row direction may be selected. As any one of the word lines WL1 to WLn is selected, one page may be selected in the selected cell strings.

In an embodiment, even bit lines and odd bit lines may be provided instead of the first to mth bit lines BL1 to BLm. In addition, even-numbered cell strings among the cell strings CS11 to CS1$m$ or CS21 to CS2$m$ arranged in the row direction may be coupled to the even bit lines, respectively, and odd-numbered cell strings among the cell strings CS11 to CS1$m$ or CS21 to CS2$m$ arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
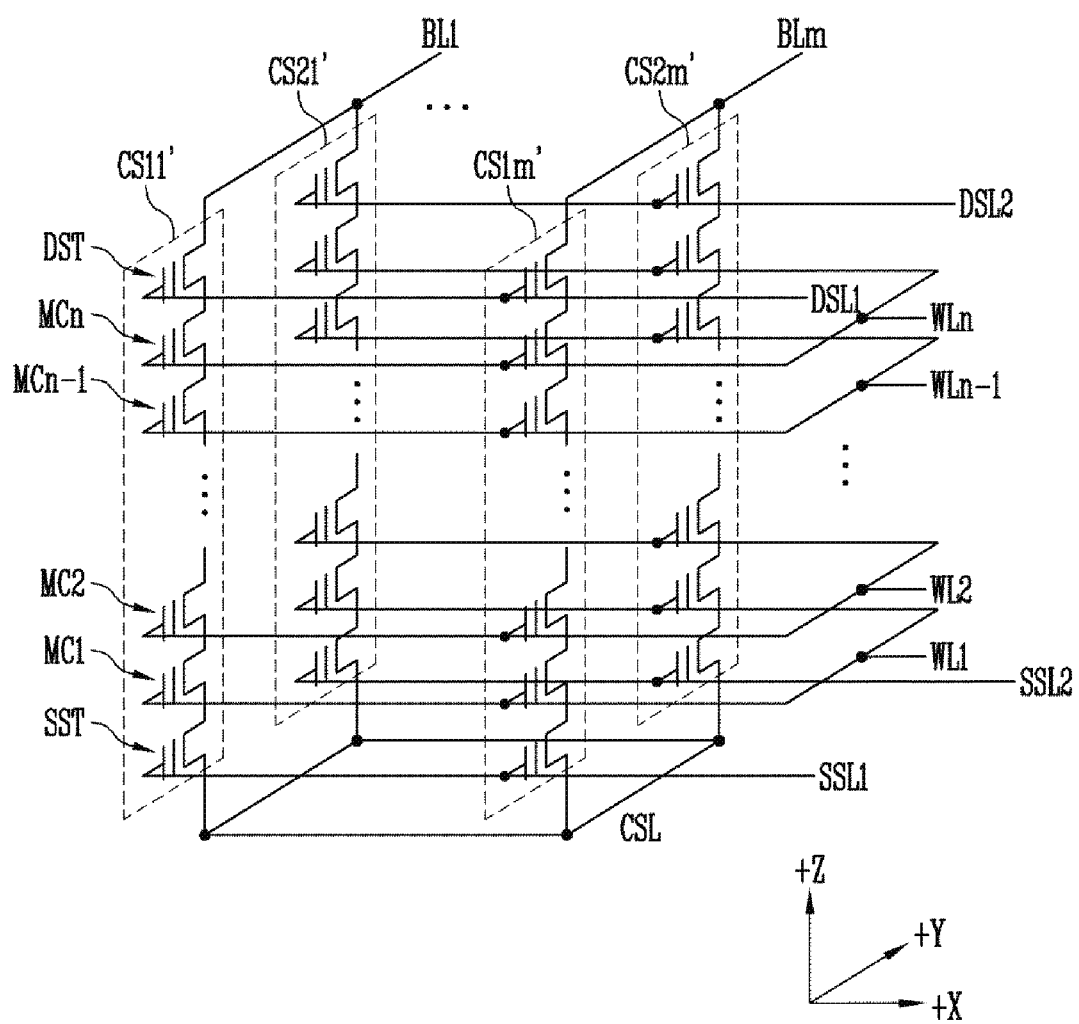
FIG. 5 is a circuit diagram illustrating another embodiment of the one memory block among the memory blocks shown in FIG. 3.

FIG. 5 is a circuit diagram illustrating any one memory block BLKb among the memory blocks BLK1 to BLKz shown in FIG. 3 in accordance with another embodiment.

Referring to FIG. 5, the memory block BLKb may include a plurality of cell strings CS11' to CS1$m$' and CS21' to CS2$m$'. Each of the plurality of cell strings CS11' to CS1$m$' and CS21' to CS2$m$' extends along the +Z direction. Each of the plurality of cell strings CS11' to CS1$m$' and CS21' to CS2$m$' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1$m$' arranged on a first row are coupled to a first source select line SSL1. Source select transistors of the cell strings CS21' to CS2$m$' arranged on a second row are coupled to a second source select line SSL2. In another embodiment, the source select transistors of the cell strings CS11' to CS1$m$' and CS21' to CS2$m$' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1$m$' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
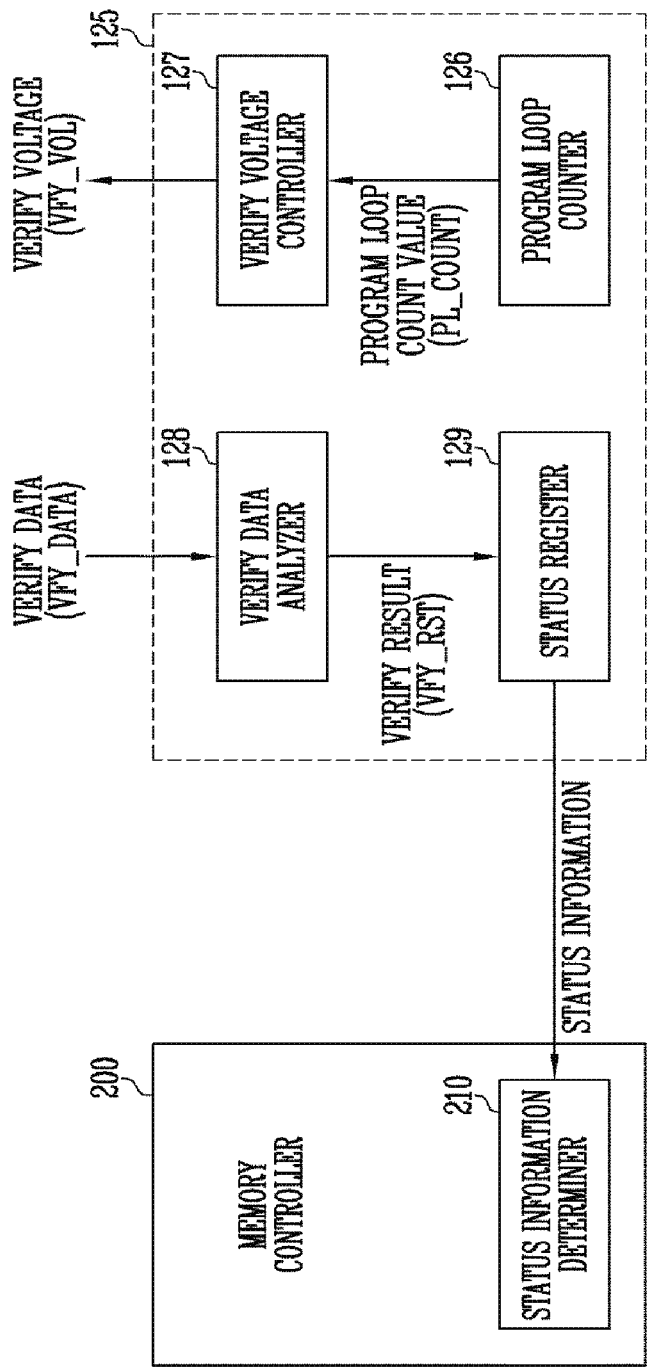
FIG. 6 is a diagram illustrating a configuration of a control logic and a memory controller, which are included in the memory device shown in FIG. 1.

FIG. 6 is a diagram illustrating a configuration of the control logic 125 and the memory controller 200, which are included in the memory device shown in FIG. 1.

Referring to FIG. 6, the control logic 125 may include a program loop counter 126, a verify voltage controller 127, a verify data analyzer 128, and a status register 129. In addition, the memory controller 200 shown in FIG. 6 may include a status information determiner 210.

The program loop counter 126 may count a number of at least one program loop. The at least one program loop may be performed on a page including a memory cell to be programmed among a plurality of pages included in the memory device 100. Each of the plurality of pages may include a plurality of memory cells.

Specifically, the program loop may include a program voltage applying phase and a program verify phase. The program voltage applying phase may be a phase for applying a program voltage to a word line to which a plurality of memory cells are coupled. The program verify phase may be a phase for determining whether a selected memory cell among the plurality of memory cells has been completely programmed.

Consequently, the program loop counter 126 may count a number of program loops, with each program loop including the program voltage applying phase and the program verify phase, which are performed to program the selected memory cell.

The program loop counter 126 may generate a program loop count value PL_COUNT obtained by counting a number of program loops. The program loop counter 126 may generate a program loop count value PL_COUNT whenever a number of program loops is counted. That is, the program loop count value PL_COUNT may be incremented by 1 whenever a program loop is performed.

The program loop counter 126 may provide the generated program loop count value PL_COUNT to the verify voltage controller 127.

The verify voltage controller 127 may control a kind of verify operation performed in a program verify phase and a level of a verify voltage VFY_VOL. In an embodiment, the program verify phase may include at least one of an auxiliary verify operation of applying an auxiliary verify voltage Vvfya to a word line to which a plurality of memory cells are coupled and a main verify operation of applying a main verify voltage Vvfym larger than the auxiliary verify voltage Vvfya.

The verify voltage controller 127 may control a verify voltage VFY_VOL to be applied to the word line in the program verify phase, based on a program loop count value PL_COUNT generated by counting a number of at least one program loop. The program loop count value PL_COUNT may be received from the program loop counter 126. Also, the program loop count value PL_COUNT may be a value obtained by counting a number of program loops performed on the selected memory cell.

In an embodiment, the verify voltage controller 127 may control the kind of the verify operation and the level of the verify voltage VFY_VOL, based on the program loop count value PL_COUNT. When the program loop count value PL_COUNT is less than a pre-stored reference value, the verify voltage controller 127 might control only the main verify operation to be performed in the program verify phase. On the contrary, when the program loop count value PL_COUNT is the pre-stored reference value or more, the verify voltage controller 127 might control the auxiliary verify operation and the main verify operation to be performed in the program verify phase.

The verify voltage controller 127 may output a verify voltage VFY_VOL determined based on the program loop count value PL_COUNT. The verify voltage VFY_VOL may be applied to a word line to which a plurality of memory cells are coupled. When the verify voltage controller 127 determines that only the main verify operation is performed in the program verify phase, the main verify voltage Vvfym may be applied to the word line. When the verify voltage controller 127 determines that the auxiliary verify operation and the main verify operation are performed in the program verify phase, the auxiliary verify voltage Vvfya and the main verify voltage Vvfym may be applied to the word line. The verify voltage controller 127 may control the main verify voltage Vvfym to be applied to the word line after the auxiliary verify voltage Vvfya is applied to the word line. That is, the verify voltage controller 127 may control the main verify operation to be performed after the auxiliary verify operation is performed in the program verify phase.

The verify data analyzer 128 may receive verify data VFY_DATA. The verify data VFY_DATA may be a result obtained by performing the program verify phase included in at least one program loop. That is, the verify data VFY_DATA may be data about a result obtained by performing at least one of the auxiliary verify operation and the main verify operation, which are included in the program verify phase.

The verify data analyzer 128 may generate a verify result VFY_RST, based on the verify data VFY_DATA. When only a result obtained by performing only the main verify operation is included in the verify data VFY_DATA, the verify data analyzer 128 might not generate the verify result VFY_RST. That is, when only the main verify operation is performed, a plurality of program loops might all be performed without determination of program pass or program fail.

However, when a result obtained by performing the auxiliary verify operation in addition to the main verify operation is included in the verify data VFY_DATA, the verify data analyzer 128 may generate the verify result VFY_RST. The verify result VFY_RST may be generated by counting a number of turned-on or turned-off memory cells included in the verify data VFY_DATA.

Specifically, the verify data VFY_DATA may include data for sorting turned-on or turned-off memory cells in the auxiliary verify operation and the main verify operation. In an embodiment, when a memory cell is turned on, the verify data VFY_DATA about the corresponding memory cell may include "0." On the contrary, when a memory cell is turned off, the verify data VFY_DATA about the corresponding memory cell may include "1." That is, data for distinguishing between a turned-on and a turned-off state of a memory cell may be stored in the verify data VFY_DATA.

Therefore, the verify data analyzer 128 may count a number of turned-on or turned-off memory cells in the auxiliary verify operation and the main verify operation by receiving the verify data VFY_DATA. That is, the verify data analyzer 128 may count a number of turned-on or turned-off memory cells by counting a number of "0s" or "1s" included in the verify data VFY_DATA.

When a number of turned-on memory cells in the auxiliary verify operation is smaller than that of turned-on memory cells in the main verify operation, the verify data analyzer 128 may control a next program loop to be performed on a selected memory cells. On the contrary, when the number of turned-on memory cells in the auxiliary verify operation is greater than or equal to that of turned-on memory cells in the main verify operation, the verify data analyzer 128 may control the program loop to be stopped. Also, when the number of turned-on memory cells in the auxiliary verify operation is greater than or equal to that of turned-on memory cells in the main verify operation, the verify data analyzer 128 may generate a verify result VFY_RST representing fail of a program operation.

In an embodiment, because the main verify voltage Vvfym is larger than the auxiliary verify voltage Vvfya, the number of turned-on memory cells in the auxiliary verify operation may be smaller than that of turned-on memory cells in the main verify operation. On the contrary, a number of turned-off memory cells in the auxiliary verify operation may be greater than that of turned-off memory cells in the main verify operation.

However, in a process in which a word line is discharged after the program voltage applying phase, a gate voltage of memory cells coupled to the word line may have a value that is not "0" due to a resistive element of the word line even when the word line is discharged. Hence, the auxiliary verify voltage Vvfya may be larger than the main verify voltage Vvfym.

Therefore, when a discharge characteristic of the word line is poor, the number of turned-on memory cells in the auxiliary verify operation may be greater than that of turned-on memory cells in the main verify operation. On the contrary, the number of turned-off memory cells in the auxiliary verify operation may be smaller than that of turned-off memory cells in the main verify operation.

The verify data analyzer 128 may determine fail of the program operation, based on the verify data VFY_DATA that is a result obtained by performing the auxiliary verify operation and the main verify operation. That is, the verify data analyzer 128 may generate a verify result VFY_RST, based on a number of turned-on or turned-off memory cells in the auxiliary verify operation and the main verify operation. The verify result VFY_RST may include information representing pass or fail of the program operation. Also, the verify result VFY_RST may include a representation that the pass or fail of the program operation has been determined based on the number of turned-on or turned-off memory cells in the auxiliary verify operation and the main verify operation. That is, the verify result VFY_RST may include information representing that the pass or fail of the program operation has been determined when a plurality of program loops are not all performed.

In an embodiment, when the discharge characteristic of the word line is poor, i.e., when the number of turned-on memory cells in the auxiliary verify operation is greater than or equal to that of turned-on memory cells in the main verify operation, the verify data analyzer 128 may generate a verify result VFY_RST representing the fail of the program operation. Also, the verify data analyzer 128 may generate a verify result VFY_RST representing that the fail of the program operation has been determined based on the turn-on memory cells.

The status register 129 may store status information Status Information, based on a verify result VFY_RST. The verify result VFY_RST may be generated based on the verify data VFY_DATA that is a result obtained by performing the auxiliary verify operation and the main verify operation in the program verify phase. The verify result VFY_RST may include information representing pass or fail of a program operation.

The status information Status Information may include information representing the pass or fail of the program operation. In the present disclosure, the status information Status Information may include information representing that the pass or fail of the program operation has been determined based on the number of turned-on or turned-off memory cells included in the verify data VFY_DATA, in addition to the pass or fail of the program operation. The information representing that the pass or fail of the program operation has been determined based on the number of turned-on or turned-off memory cells included in the verify data VFY_DATA may be information on a flag Flag. The status register 129 may store the flag Flag, based on the information on the flag Flag. The flag Flag may be "0" or "1."

Consequently, the status register 129 may store data representing pass or fail of a program operation performed on a selected memory cell and a flag Flag representing that the pass or fail of the program operation has been determined based on a number of turned-on or turned-off memory cells included in the verify data VFY_DATA.

The status information determiner 210 included in the memory controller 200 may receive status information Status Information, corresponding to a status read command. The status information Status Information may be information stored in the status register 129. The status information Status Information may include information representing pass or fail of a program operation and information representing that the pass or fail of the program operation has been determined based on a number of turned-on or turned-off memory cells included in the verify data VFY_DATA. The status information determiner 210 may determine pass or fail of an operation performed by the memory device 100 by receiving the status information Status Information stored in the status register 129.

Figure 7:
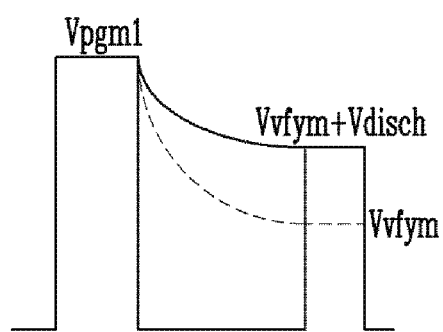
FIG. 7 is a diagram illustrating an embodiment in which a program verify voltage is increased.

FIG. 7 is a diagram illustrating an embodiment in which a program verify voltage is increased.

Referring to FIG. 7, any one program loop among a plurality of program loops performed on a selected memory cell is illustrated in FIG. 7. Each of the plurality of program loops may include a program voltage apply phase for applying a program voltage and a program verify phase for determining whether a selected memory cell has been completely programmed. FIG. 7 illustrates a program voltage applying phase and a program verify phase, which are included in one program loop.

A program loop may be performed on a selected memory cell among a plurality of memory cells included in the memory device 100. That is, a program voltage applying phase and a program verify phase may be performed on the selected memory cell. When the program verify phase is completed, a next program loop may be performed.

In an embodiment, in order to program a selected memory cell, a first program voltage Vpgm1 may be applied to a selected word line in the program voltage applying phase. A plurality memory cells of a page including the selected memory cell may be coupled to the selected word line.

After the selected memory cell is programmed by applying the first program voltage Vpgm1 to the selected word line, the program verify phase may be performed. In the program verify phase, when only a main verify operation is performed, only a main verify voltage Vvfym may be applied to the selected word line. In the program verify phase, when an auxiliary verify operation and the main verify operation are performed, the main verify voltage Vvfym may be applied to the selected word line after an auxiliary verify voltage Vvfya is applied to the selected word line.

In FIG. 7, a case where only main verify operation is performed in the program verify phase is assumed.

In an embodiment, a voltage Vvfym+Vdisch applied to the selected word line may be larger than a preset main verify voltage Vvfym.

Specifically, in a process in which a word line is discharged after a program voltage is applied, the discharge of the word line might not be completed due to a resistive element of the word line. When the discharge of the word line is not completed, a gate voltage of a plurality of memory cells coupled to the word line may have a value that is not "0." In an embodiment, a voltage of the word line coupled to the plurality of memory cells after the discharge of the word line may be "Vdisch."

Therefore, when the voltage Vvfym+Vdisch larger than the main verify voltage Vvfym is applied to the selected word line, a verify operation might not be performed using the main verify voltage Vvfym having a desired level. As a result, memory cells of which a program operation is completed may be determined as program fail.

Figure 8:
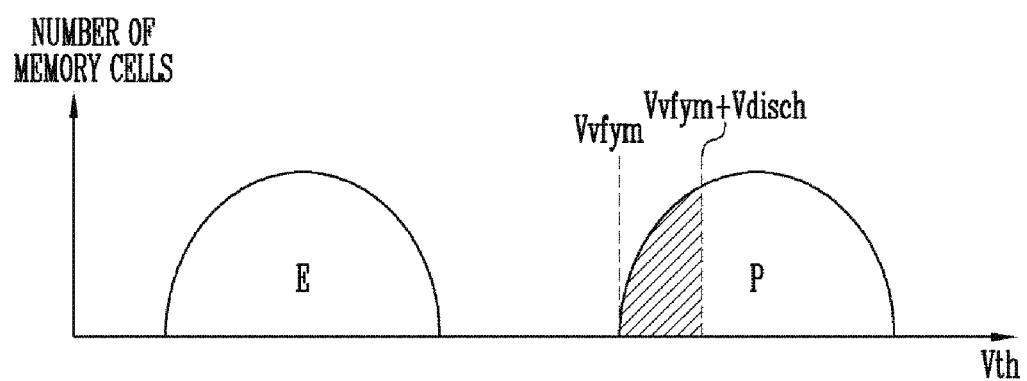
FIG. 8 is a diagram illustrating an embodiment in which a program verify voltage is increased.

FIG. 8 is a diagram illustrating an embodiment in which a program verify voltage is increased.

Referring to FIG. 8, threshold voltage distributions of memory cells are illustrated in FIG. 8. The horizontal axis shown in FIG. 8 represents magnitude of threshold voltage Vth of memory cells, and the vertical axis shown in FIG. 8 represents number of memory cells. In FIG. 8, a case where each of the memory cells included in the memory device 100 is a Single Level Cell (SLC) configured to store one data bit is assumed. Therefore, each of the memory cells included in the memory device 100 may have any one of an erase state E and a single program state P. The threshold voltage distribution shown in FIG. 8 represents a threshold voltage distribution after a plurality of program loops are performed so as to program a selected memory cell.

Memory cells may be in the erase state E at the beginning. Subsequently, the memory cells in the erase state may be programmed. The memory cells initially in the erase state E may be in the program state P after a plurality of program loops. Each of the plurality of program loops may include a program voltage applying phase and a program verify phase. When the memory cells in the erase state E are programmed, the memory device 100 may check whether the memory cells are in the program state P through the program verify phase.

In the program verify phase, a main verify operation may be performed. The main verify operation may be an operation of determining whether a selected memory cell has been programmed by applying a main verify voltage Vvfym to a word line to which a selected memory cell is coupled. Therefore, the main verify voltage Vvfym may be a voltage for distinguishing the erase state E and the program state P.

However, the main verify voltage Vvfym may be increased due to a discharge characteristic of the word line. That is, in a process in which a selected word line is "discharged" after a program voltage is applied to the selected word line, the selected word line might not be completely discharged, and hence a gate voltage of memory cells coupled to the selected word line might have a value that is not truly "0." Therefore, the main verify voltage Vvfym may be effectively changed to a voltage Vvfym+Vdisch that cannot distinguish between the erase state E and the program state P, as illustrated in FIG. 8.

When the main verify voltage cannot distinguish the program state P and the erase state E, although a memory cell is a programmed memory cell, the programmed memory cell may be turned on when the changed main verify voltage Vvfym+Vdisch is applied to the selected word line.

That is, in a verify operation, although the memory cell is programmed to be turned off, the memory cell may be turned on. When the memory cell is turned on even though it is to be turned off, it may be determined that the discharge characteristic of the word line is poor. That the discharge characteristic of the word line is poor may mean that the gate voltage of the memory cells coupled to the selected word line does not become 0V after the program voltage is applied.

When the discharge characteristic of the word line is poor, Uncorrectable ECC (UECC) fail may occur in a subsequent read operation even though a program operation passes. When the UECC fail occurs, a problem may occur that data stored in a selected page or a memory block including the selected page cannot be recovered.

Thus, in the present disclosure, a characteristic of a word line is recognized in a program operation before a read operation, so that occurrence of UECC fail can be prevented in advance. That is, in the present disclosure, a program operation can be processed as fail in a process of performing a program loop, based on the discharge characteristic of the word line, so as to prevent occurrence of fail in the read operation.

Figure 9:
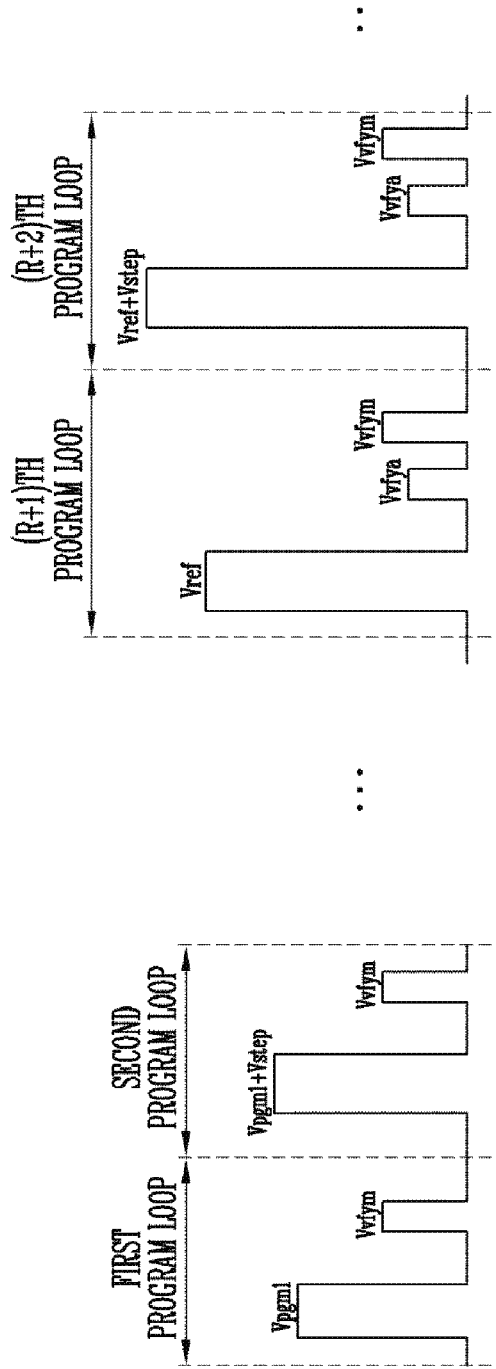
FIG. 9 is a diagram illustrating a program verify method in accordance with an embodiment of the present disclosure.

FIG. 9 is a diagram illustrating a program verify method in accordance with an embodiment of the present disclosure.

Referring to FIG. 9, a process in which a selected memory cell is in the program state is illustrated in FIG. 9. FIG. 9 is a diagram illustrating some of a plurality of program loops performed in the selected memory cell.

Specifically, a selected memory cell among a plurality of memory cells included in a memory block may be programmed. In order to program the selected memory cell, at least one program loop may be performed on the selected memory cell. The program loop may include a program voltage applying phase for applying a program voltage to a word line to which the selected memory cell is coupled and a program verify phase for determining whether the selected memory cell has been completely programmed.

In an embodiment, a first program loop may include a phase for applying a first program voltage Vpgm1 to the word line and a program verify phase for applying a main verify voltage Vvfym to the word line. Therefore, in order to program the selected memory cell, the first program voltage Vpgm1 may be applied to the word line to which the selected memory cell is coupled. After the first program voltage Vpgm1 is applied to the word line to which the selected memory cell is coupled, the main verify voltage Vvfym may be applied to the word line so as to check whether the selected memory cell has been programmed.

When the selected memory cell is not programmed even though the first program loop is performed, a second program loop may be performed on the selected memory cell. The second program loop may include a phase for applying a voltage Vpgm1+Vstep higher by a step voltage than the first program voltage Vpgm1 to the word line and a program verify phase for applying the main verify voltage Vvfym to the word line.

Therefore, in order to program the selected memory cell, the voltage Vpgm1+Vstep higher by the step voltage than the first program voltage may be applied to the word line to which the selected memory cell is coupled. After the program voltage is applied to the word line to which the selected memory cell is coupled, the main verify voltage Vvfym may be applied to the word line so as to check whether the selected memory cell has been programmed.

Subsequently, a plurality of program loops for programming the selected memory cell may be performed on the selected memory cell.

When a number of the plurality of program loops performed on the selected memory cell reaches a reference value, a program verify phase included in a subsequent program loop may include an auxiliary verify operation of applying an auxiliary verify voltage Vvfya to the word line and a main verify operation of applying a main verify voltage Vvfym larger than the auxiliary verify voltage Vvfya. The main verify operation may be performed after the auxiliary verify operation is performed on the selected memory cell.

In an embodiment, when the number of the plurality of program loops performed on the selected memory cell is "R," a program verify phase of each of program loops from an (R+1)th program loop may include an auxiliary verify operation and a main verify operation. Specifically, in order to program the selected memory cell, the (R+1)th program loop may be performed on the selected memory cell.

In an embodiment, the (R+1)th program loop may include a phase for applying a reference program voltage Vref to the word line and a program verify phase for applying the auxiliary verify voltage Vvfya and the main verify voltage Vvfym to the word line. Therefore, in order to program the selected memory cell, the reference program voltage Vref may be applied to the word line to which the selected memory cell is coupled. After the reference program voltage Vref is applied to the word line to which the selected memory cell is coupled, the auxiliary verify voltage Vvfya and the main verify voltage Vvfym may be applied to the word line so as to check whether the selected word line has been programmed.

When the selected memory cell is not programmed even though the (R+1)th program loop is performed, an (R+2)th program loop may be performed on the selected memory cell. The (R+2)th program loop may include a phase for applying a voltage higher by a step voltage than the reference program voltage Vref to the word line and a program verify phase for applying the auxiliary verify voltage Vvfya and the main verify voltage Vvfym to the word line.

Therefore, in order to program the selected memory cell, a voltage Vref+Vstep higher by a step voltage than the reference program voltage may be applied to the word line to which the selected memory cell is coupled. After the voltage Vref+Vstep higher by the step voltage than the reference program voltage is applied to the word line to which the selected memory cell is coupled, the main verify voltage Vvfym may be applied to the word line so as to check whether the selected memory cell has been programmed.

Subsequently, additional program loops may be performed so as to program the selected memory cell.

Figure 10:
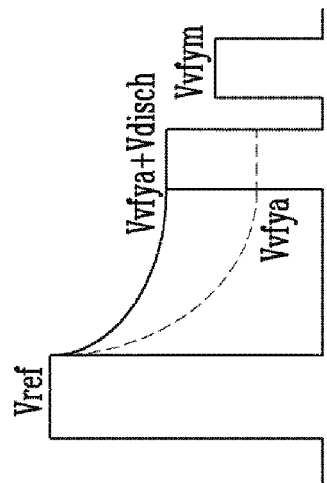
FIG. 10 is a diagram illustrating reversal of an auxiliary verify voltage.

FIG. 10 is a diagram illustrating reversal of an auxiliary verify voltage.

Referring to FIG. 10, an (R+1)th program loop performed after a number of a plurality of program loops performed on a selected memory cell reaches a reference value "R" is illustrated in FIG. 10.

The (R+1)th program loop may be performed so as to program the selected memory cell. The (R+1)th program loop may include a program voltage applying phase and a program verify phase. A program voltage applied in the program voltage applying phase of the (R+1)th program loop may be a reference program voltage Vref. In addition, an operation performed in the program verify phase of the (R+1)th program loop may include an auxiliary verify operation and a main verify operation.

In an embodiment, the reference program voltage Vref may be applied to a word line to which the selected memory cell is coupled. When the reference program voltage Vref is applied to the word line to which the selected memory cell is coupled, the selected memory cell may be programmed. The program verify phase may be performed so as to check whether the selected memory cell has been programmed.

In an embodiment, the auxiliary verify operation and the main verify operation may be performed on the selected memory cell. The auxiliary verify operation may be a verify operation performed by applying an auxiliary verify voltage Vvfya to the word line to which the selected memory cell is coupled. In addition, the main verify operation may be a verify operation performed by applying a main verify voltage Vvfym to the word line to which the selected word line is coupled. The main verify voltage Vvfym may be applied after the auxiliary verify voltage Vvfya is applied to the word line to which the selected memory cell is coupled. The main verify voltage Vvfym may have a value larger than that of the auxiliary verify voltage Vvfya.

However, in a process of discharging the word line to which the selected memory cell is coupled after the reference program Vref is applied, the discharge of the word line might not be completed due to a resistive element of the word line. That is, a gate voltage of a plurality of memory cells coupled to the word line may have a value that is not "0." In an embodiment, in the auxiliary verify operation included in the program verify phase, a voltage higher by a voltage Vdisch caused by a discharge characteristic of the word line than the auxiliary verify voltage Vvfya may be applied to the word line.

Therefore, although the auxiliary verify voltage Vvfya is applied to the word line, a voltage higher than the main verify voltage Vvfym may be effectively applied to the word line. Such a phenomenon is referred to as reversal of the auxiliary verify voltage Vvfya.

The reversal of the auxiliary verify voltage Vvfya may mean that the discharge characteristic of the word line is poor. That the discharge characteristic of the word line is poor may mean that the gate voltage of the memory cells coupled to the selected word line after the program voltage applying phase is not 0V.

When the discharge characteristic of the word line is poor, Uncorrectable ECC (UEDD) fail may occur in a read operation after a program operation. When the UECC fail occurs, data might not be recovered. Therefore, in the program verify phase, the discharge characteristic of the word line may be determined, and data may be recovered by processing the program operation as fail when the discharge characteristic of the word line is poor. That is, when the program operation fails, program data may be programmed in a memory cell included in another memory block.

Consequently, the discharge characteristic of the word line may be determined based on a number of turned-on or turned-off memory cells, which is determined through the program verify phase.

A method for determining the discharge characteristic of the word line and a method for processing the program operation as fail in the program verify phase will be described in more detail with reference to FIGS. 11 and 12.

Figure 11:
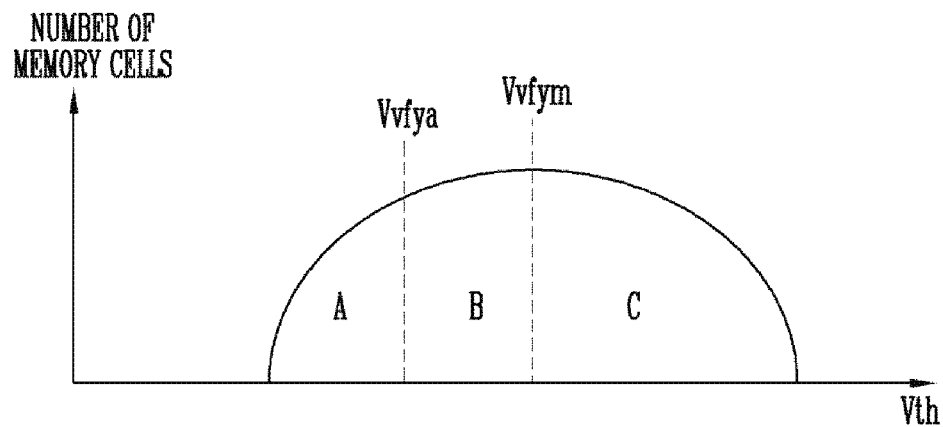
FIG. 11 is a diagram illustrating an embodiment in which a discharge characteristic of a word line is determined.

FIG. 11 is a diagram illustrating an embodiment in which a discharge characteristic of a word line is determined.

Referring to FIG. 11, a threshold voltage distribution of memory cells programmed after a number of a plurality of program loops performed on a selected memory cell reaches a reference value is illustrated in FIG. 11. The horizontal axis shown in FIG. 11 represents magnitude of threshold voltage Vth of memory cells, and the vertical axis shown in FIG. 11 represents number of memory cells. In FIG. 11, a case where an auxiliary verify voltage Vvfya is not reversed is assumed.

In an embodiment, the selected memory cell may be in the program state through a plurality of program loops. Each of the plurality of program loops may include a program voltage applying phase and a program verify phase.

In an embodiment, when a number of the plurality of program loops performed on the selected memory cell reaches a reference value, the control logic included in the memory device 100 may control an auxiliary verify operation and a main verify operation to be performed in succession for the program verify phase.

In the program verify phase, the auxiliary verify operation may be performed. The auxiliary verify operation may be an operation of checking whether memory cells coupled to a word line to which the selected memory cell is coupled have been programmed by applying the auxiliary verify voltage Vvfya to the word line. When the auxiliary verify operation is performed, programmed memory cells may be turned off (Off Cell), and unprogrammed memory cells in the erase state may be turned on (On Cell).

In an embodiment, when the auxiliary verify operation is performed, memory cells in region A may be turned on, and memory cells in regions B and C may be turned off.

In the program verify phase, the main verify operation may be performed. The main verify operation may be an operation of checking whether a plurality of memory cells coupled to the word line to which the selected memory cell is coupled by applying a main verify voltage Vvfym to the word line. When the main verify operation is performed, programmed memory cells may be turned off, and unprogrammed memory cells in the erase state may be turned on.

In an embodiment, when the main verify operation is performed, the memory cells in the regions A and B may be turned on, and the memory cells in the region C may be turned off.

Consequently, because the main verify voltage Vvfym is larger than the auxiliary verify voltage Vvfya, it may be determined that the characteristic of the word line is satisfactory when a number of the memory cells (A) turned on by performing a verify operation using the auxiliary verify voltage Vvfya is smaller than that of the memory cells (A+B) turned on by performing a verify operation using the main verify voltage Vvfym. Additionally or alternatively, it may be determined that the characteristic of the word line is satisfactory when a number of the memory cells (B+C) turned off by performing a verify operation using the auxiliary verify voltage Vvfya is greater than that of the memory cells (C) turned off by performing a verify operation using the main verify voltage Vvfym.

Figure 12:
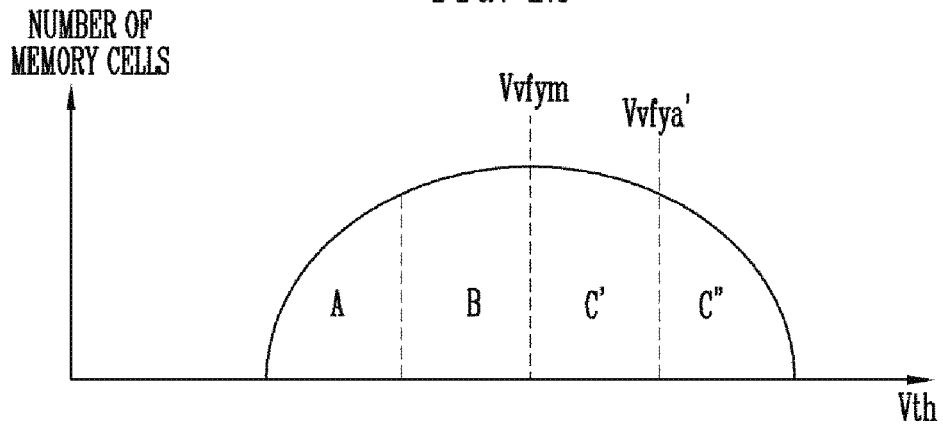
FIG. 12 is a diagram illustrating an embodiment in which a program operation fails.

FIG. 12 is a diagram illustrating an embodiment in which a program operation fails.

Referring to FIG. 12, a threshold voltage distribution of memory cells programmed after a number of a plurality of program loops performed on a selected memory cell reaches a reference value is illustrated in FIG. 12. The horizontal axis shown in FIG. 12 represents magnitude of threshold voltage Vth of memory cells, and the vertical axis shown in FIG. 12 represents number of memory cells. In FIG. 12, a case where an auxiliary verify voltage Vvfya is reversed (Vvfya') is assumed. For example, a reversed auxiliary verify voltage Vvfya' may have a magnitude larger than that of a main verify voltage Vvfym. That is, generally, a magnitude of the auxiliary verify voltage Vvfya is smaller than that of the main verify voltage Vvfym, but when the auxiliary verify voltage Vvfya is reversed, the magnitude of the auxiliary verify voltage Vvfya may be larger than that of the main verify voltage Vvfym.

In an embodiment, the selected memory cell may be in the program state through a plurality of program loops. Each of the plurality of program loops may include a program voltage applying phase and a program verify phase. When a number of the plurality of program loops performed on the selected memory cell reaches a reference value, the control logic included in the memory device 100 may control an auxiliary verify operation and a main verify operation to be performed in the program verify phase.

In the program verify phase, the auxiliary verify operation may be performed. The auxiliary verify operation may be an operation of checking whether memory cells coupled to a word line to which the selected memory cell is coupled have been programmed by applying the auxiliary verify voltage Vvfya to the word line.

Unlike FIG. 11, in FIG. 12, the auxiliary verify voltage is reversed, and hence the reversed auxiliary verify voltage Vvfya' may have a magnitude larger than that of a main verify voltage Vvfym. Therefore, when the auxiliary verify operation is performed in the program verify phase, memory cells in regions A, B, and C' may be turned on (On Cell), and memory cells region C" may be turned off (Off Cell).

In the program verify phase, the main verify operation may be performed. The main verify operation may be an operation of checking whether a plurality of memory cells coupled to the word line to which the selected memory cell is coupled by applying the main verify voltage Vvfym to the word line.

When the main verify operation is performed, programmed memory cells may be turned off, and unprogrammed memory cells in the erase state may be turned on. Therefore, when the main verify operation is performed in the program verify phase, the memory cells in the regions A and B may be turned on (On Cell), and the memory cells in the regions C' and C" may be turned off (Off Cell).

Consequently, because the auxiliary verify voltage is reversed (Vvfya'), it may be determined that the characteristic of the word line is poor when a number of the memory cells (A+B+C') turned on by performing a verify operation using the reversed auxiliary verify voltage Vvfya' is greater than that of the memory cells (A+B) turned on by performing a verify operation using the main verify voltage Vvfym. Additionally or alternatively, it may be determined that the characteristic of the word line is poor when a number of the memory cells (C") turned off by performing a verify operation using the reversed auxiliary verify voltage Vvfya' is smaller than that of the memory cells (C'+C") turned off by performing a verify operation using the main verify voltage Vvfym.

When the discharge characteristic of the word line is poor, a program operation performed in the present teachings may be processed as fail.

Specifically, the verify data analyzer 128 included in the control logic 125 may process a corresponding program operation as fail when it is determined that the discharge characteristic of the word line is poor because the auxiliary verify voltage Vvfya is reversed after the verify data analyzer 128 receives verify data VFY_DATA through the program verify phase.

Therefore, the verify data analyzer 128 may generate a verify result representing that the program operation has failed, when a number of memory cells turned on by performing a verify operation, using the reversed auxiliary verify voltage Vvfya', is greater than that of memory cells turned on by performing a verify operation, using the main verify voltage Vvfym. Also, the verify data analyzer 128 may generate a verify result representing that the program operation has failed, when a number of memory cells turned off by performing a verify operation, using the reversed auxiliary verify voltage Vvfya', is greater than that of memory cells turned off by performing a verify operation, using the main verify voltage Vvfym.

Figure 13:
FIG. 13 is a diagram illustrating information included in a verify result.

FIG. 13 is a diagram illustrating information included in a verify result.

Referring to FIG. 13, fail information Fail information (FI) and a flag Flag, which are included in the verify result VFY_RST, are illustrated in FIG. 13. The fail information FI may include information representing that a program operation performed on a selected memory cell has failed. The flag Flag may include information representing that the program operation has failed without performing all predetermined program loops.

Specifically, the fail information FI may include information representing that the program operation has failed.

Referring to FIGS. 12 and 13, when the auxiliary verify voltage Vvfya is reversed due to the discharge characteristic of the word line, a number of memory cells turned on by performing a verify operation, using the reversed auxiliary verify voltage Vvfya', may be greater than that of memory cells turned on by performing a verify operation, using the main verify voltage Vvfym. That is, after the program voltage applying phase, the auxiliary verify voltage Vvfya may be reversed (Vvfya') even when the auxiliary verify voltage Vvfya is to be smaller than the main verify voltage Vvfym due to the discharge characteristic of the word line.

Therefore, the verify data analyzer 128 included in the control logic may process a corresponding program operation as fail by counting a number of turned-on memory cells through the auxiliary verify operation and the main verify operation. The verify data analyzer 128 may generate a verify result VRY_RST including fail information FI that is information representing that the program operation has failed.

In another embodiment, when the auxiliary verify voltage Vvfya is reversed due to the discharge characteristic of the word line, a number of memory cells turned off by performing a verify operation, using the reversed auxiliary verify voltage Vvfya', may be smaller than that of memory cells turned off by performing a verify operation, using the main verify voltage Vvfym. Similarly, the verify data analyzer 128 included in the control logic may process a corresponding program operation as fail by counting a number of turned-off memory cells through the auxiliary verify operation and the main verify operation. The verify data analyzer 128 may generate a verify result VRY_RST including fail information FI that is information representing that the program operation has failed.

The flag Flag may include information representing through which process the program operation has been determined as fail.

Conventionally, when a plurality of program loops were performed on a selected memory cell, program pass or program fail was not determined until the plurality of program loops were all performed. That is, fast cells and slow cells among a plurality of memory cells were sorted based on the speed of a memory cell to be programmed, and a program loop was performed until a program operation was completed. When the plurality of program loops were all performed, pass or fail of the program operation was determined based on the plurality of performed program loops.

However, in the present disclosure, although a plurality of program loops are not all performed, pass or fail of a program operation may be determined. That is, when it is determined that the discharge characteristic of the word line is poor through the program verify phase included in the program loop, the program operation may be processed as fail. Therefore, although the plurality of program loops are not all performed, the program operation may fail.

In an embodiment, when the program operation fails even though the plurality of program loops are all performed, the flag Flag may be "0." When the program operation fails while the plurality of program loops are being performed, the flag Flag may be "1."

In another embodiment, when the program operation fails even though the plurality of program loops have all been performed, the flag Flag may be "1." When the program operation fails while the plurality of program loops are being performed, the flag Flag may be "0."

Figure 14:
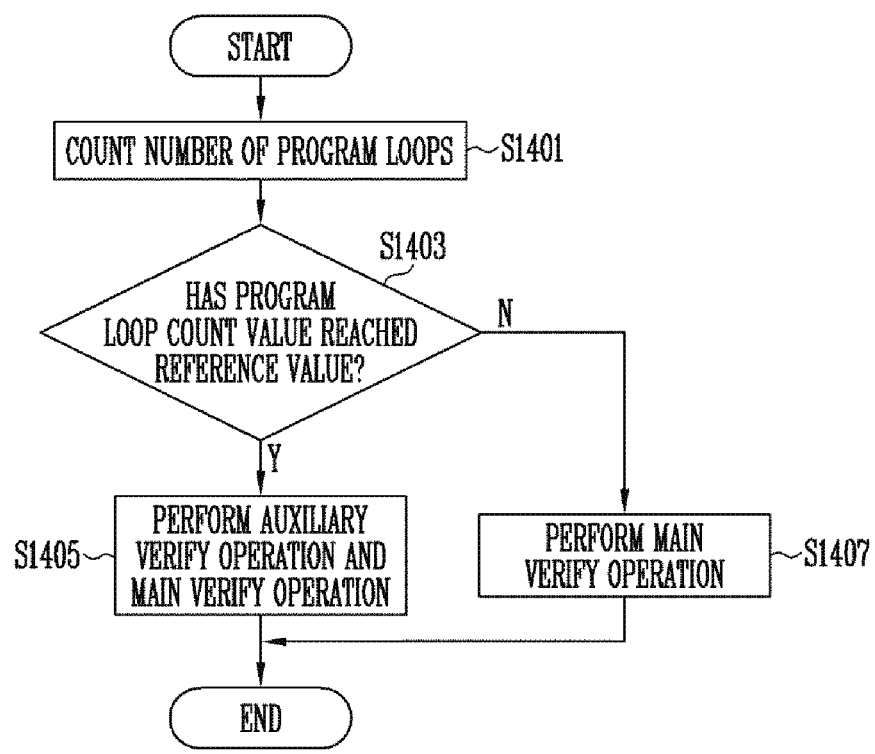
FIG. 14 is a diagram illustrating an operation of the memory device in accordance with an embodiment of the present disclosure.

FIG. 14 is a diagram illustrating an operation of the memory device in accordance with an embodiment of the present disclosure.

Referring to FIG. 14, in step S1401, the program loop counter 126 may count a number of program loops. The program loop may include a program voltage applying phase and a program verify phase. The program voltage applying phase may be a phase for applying a program voltage to a word line to which a selected memory cell is coupled so as to program the selected memory cell. The program verify phase may be a phase for applying a verify voltage to the word line to which the selected memory cell is coupled so as to determine whether the selected memory cell has been programmed.

In an embodiment, the program loop counter 126 may generate a program loop count value PL_COUNT obtained by counting a number of program loops. The program loop count value PL_COUNT may be counted whenever a program loop is performed on the selected memory cell. That is, when a program loop is performed on the selected memory cell, the program loop count value may be incremented by "1."

In step S1403, the verify voltage controller 127 may determine whether the program loop count value PL_COUNT has reached a reference value. In an embodiment, the verify voltage controller 127 may store the reference value.

The verify voltage controller 127 may receive a program loop count value PL_COUNT from the program loop counter 126. The verify voltage controller 127 may determine whether the received program loop count value PL_COUNT has reached the stored reference value.

When the program loop count value PL_COUNT reaches the reference value, the operation proceeds to step S1405. When the program loop count value PL_COUNT does not reach the reference value, the operation proceeds to step 1407.

In the step S1405, an auxiliary verify operation and a main verify operation may be performed on the selected memory cell to be programmed. Specifically, when the program loop count value PL_COUNT reaches the reference value, the verify voltage controller 127 may control the auxiliary verify operation and the main verify operation to be performed in the program verify phase. Subsequently, an auxiliary verify voltage Vvfya and a main verify voltage Vvfym may be applied to the word line, so that the auxiliary verify operation and the main verify operation are performed. In addition, the verify voltage controller 127 may control the main verify operation to be performed after the auxiliary verify operation is performed in the program verify phase.

In the step S1407, the main verify operation may be performed on the selected memory cell to be programmed. Specifically, when the program loop count value PL_COUNT does not reach the reference value, the verify voltage controller 127 may control only the main verify operation to be performed in the program verify phase. Subsequently, the main verify voltage Vvfym may be applied to the word line, so that the main verify operation is performed.

Figure 15:
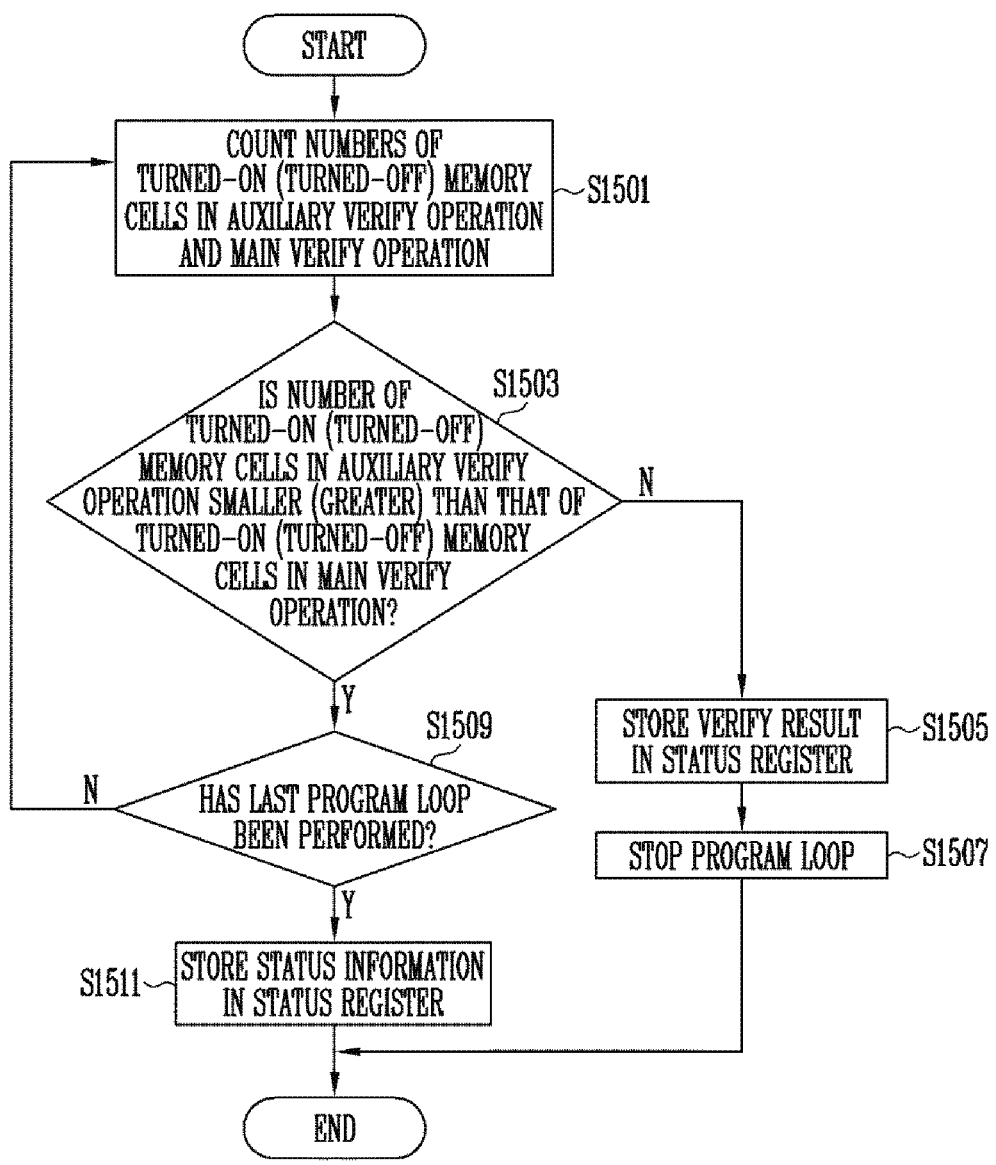
FIG. 15 is a diagram illustrating an operation of the memory device in accordance with an embodiment of the present disclosure.

FIG. 15 is a diagram illustrating an operation of the memory device in accordance with an embodiment of the present disclosure.

Referring to FIG. 15, in step S1501, the verify data analyzer 128 may count numbers of turn-on and turned-off memory cells in an auxiliary verify operation and a main verify operation.

Specifically, in a program operation, a program verify phase may be performed after a program voltage applying phase. The program verify phase may include the auxiliary verify operation and the main verify operation. That the auxiliary verify operation and the main verify operation being included in the program verify phase may mean that a program loop count value PL_COUNT has reached a reference value.

The verify data analyzer 128 may count a number of turned-on and/or turned-off memory cells, based on verify data VFY_DATA. When a memory cell is turned on, the verify data VFY_DATA about the corresponding memory cell may include "0." On the contrary, when a memory cell is turned off, the verify data VFY_DATA about the corresponding memory cell may include "1." Therefore, the number of turned-on or turned-off memory cells may be counted based on a number of "0s" or "1s" included in the verify data VFY_DATA.

In step S1503, the verify data analyzer 128 may determine whether a number of turned-on (turned-off) memory cells in the auxiliary verify operation is smaller (greater) than that of turned-on (turned-off) memory cells in the main verify operation. The verify data analyzer 128 may compare numbers of turned-on or turned-off memory cells through the auxiliary verify operation and the main verify operation, based on the verify data VFY_DATA.

In an embodiment, when the number of turn-on (turned-off) memory cells in the auxiliary verify operation is smaller (greater) than that of turned-on (turned-off) memory cells in the main verify operation, a discharge characteristic of a word line may be satisfactory. On the contrary, when the number of turn-on (turned-off) memory cells in the auxiliary verify operation is greater (smaller) than that of turned-on (turned-off) memory cells in the main verify operation, the discharge characteristic of the word line may be poor. In a read operation after a program operation, the program operation may be processed as fail so as to prevent Uncorrectable ECC (UECC) fail.

In step S1505, the verify data analyzer 128 may store a verify result VFY_RST in the status register 129. In an embodiment, the verify result VFY_RST may include information representing pass or fail of the program operation and information representing that the pass or fail of the program operation has been determined through a verify operation. Therefore, fail information Fail Information (FI) representing program fail and a flag Flag may be stored in the status register 129. The flag Flag may include information representing that the program fail has been determined through the auxiliary verify operation and the main verify operation.

In step S1507, the control logic 125 may stop a program loop performed on a selected memory cell. That is, a program operation performed on the selected memory cell has failed, and hence the program loop may be stopped. When the program loop is stopped, data to be programmed in the selected memory cell may be programmed in any one memory cell among a plurality of memory cells included in another memory block.

In step S1509, it may be determined whether the last program loop has been performed. That is, when the number of turn-on (turned-off) memory cells in the auxiliary verify operation is smaller (greater) than that of turned-on (turned-off) memory cells in the main verify operation, the discharge characteristic of the word line is satisfactory, and hence it is unnecessary to process the program operation as fail. Therefore, the program operation may be performed on the selected memory cell until the last program loop is performed.

When the last program loop has not yet been performed, a program loop of re-programming the selected memory cell may be performed, and the program verify phase may be performed by proceeding to the step S1501.

When the last program loop has been performed, the operation proceeds to step S1511.

In the step S1511, the verify data analyzer 128 may store status information Status Information in the status register 129. In an embodiment, the last program loop among the plurality of program loops has been performed, and hence the program operation is ended.

Therefore, when the selected memory cell is not programmed even though all the program loops have been performed, the memory device 100 may store status information Status Information representing fail of the program operation in the status register 129. On the contrary, when the selected memory cell is programmed, the memory device 100 may store status information Status Information representing pass of the program operation in the status register 129.

Figure 16:
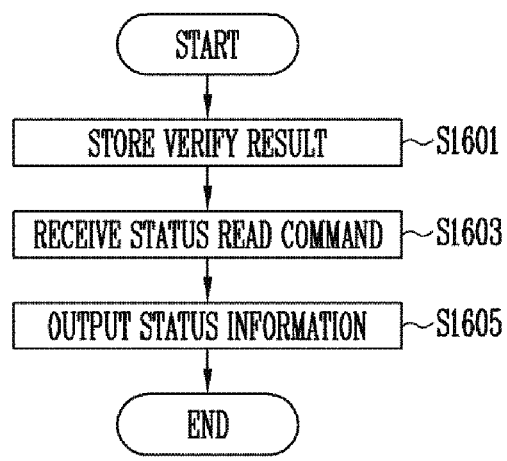
FIG. 16 is a diagram illustrating an operation of the memory device in accordance with an embodiment of the present disclosure.

FIG. 16 is a diagram illustrating an operation of the memory device in accordance with an embodiment of the present disclosure.

Referring to FIG. 16, in step S1601, the status register 129 may store a verify result VFY_RST received from the verify data analyzer 128. The verify result VFY_RST stored in the status register 129 may be status information Status Information.

In an embodiment, the status information Status Information may include information representing pass or fail of a program operation. Further, the status information State Information may include information representing that the pass or fail of the program operation has been determined without performing all predetermined program loops.

In step S1603, the memory device 100 may receive a status read command from the memory controller 200. The status read command may be a request of information representing that an operation performed by the memory device 100 has passed or failed.

In step S1605, status information Status Information may be output. Specifically, the status information Status Information stored in the status register 129 may be output to the memory controller 200 in response to the status read command.

In an embodiment, the status information Status Information may include information representing pass or fail of the program operation. Further, the status information Status Information may include information representing that the pass or fail of the program operation has been determined without performing all the predetermined program loops. The memory controller 200 may determine the pass or fail of the program operation by receiving the status information Status Information from the memory device 100. Also, the memory controller 200 may check whether the pass or fail of the program operation has been determined without performing all the predetermined program loops, by receiving the status information Status Information from the memory device 100.

Figure 17:
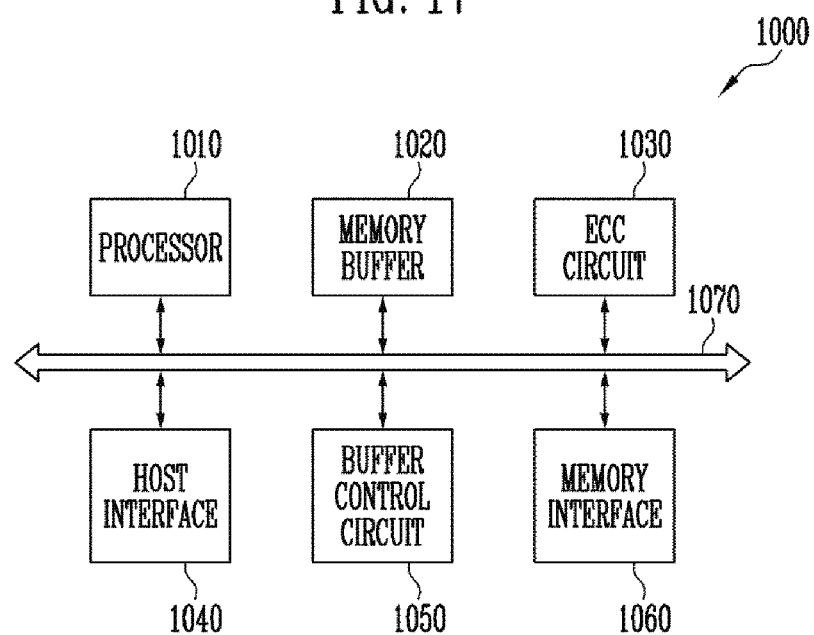
FIG. 17 is a diagram illustrating another embodiment of the memory controller shown in FIG. 1.

FIG. 17 is a diagram illustrating another embodiment of a memory controller 1000. For an embodiment, the memory controller 1000 represents the memory controller 200 shown in FIG. 1.

The memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

Referring to FIG. 17, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LPA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 might not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and might not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 18:
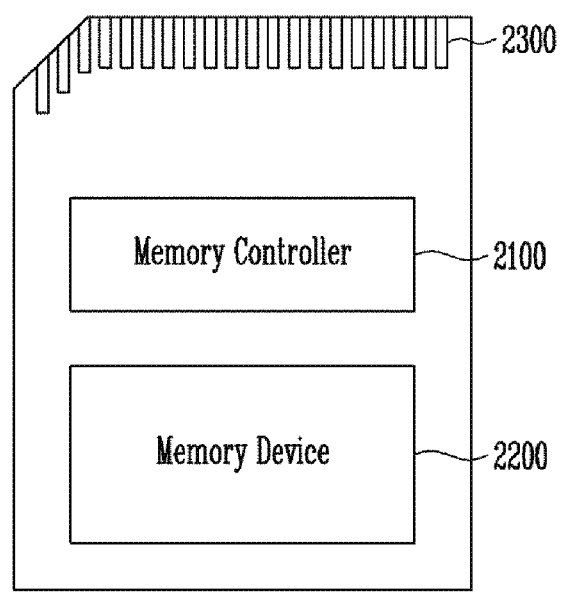
FIG. 18 is a block diagram illustrating a memory card system to which the storage device is applied in accordance with an embodiment of the present disclosure.

FIG. 18 is a block diagram illustrating a memory card system 2000 to which the storage device is applied in accordance with an embodiment of the present disclosure.

Referring to FIG. 18, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory device 2200 may be implemented identically to the memory device 100 described with reference to FIG. 10.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-M RAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 19:
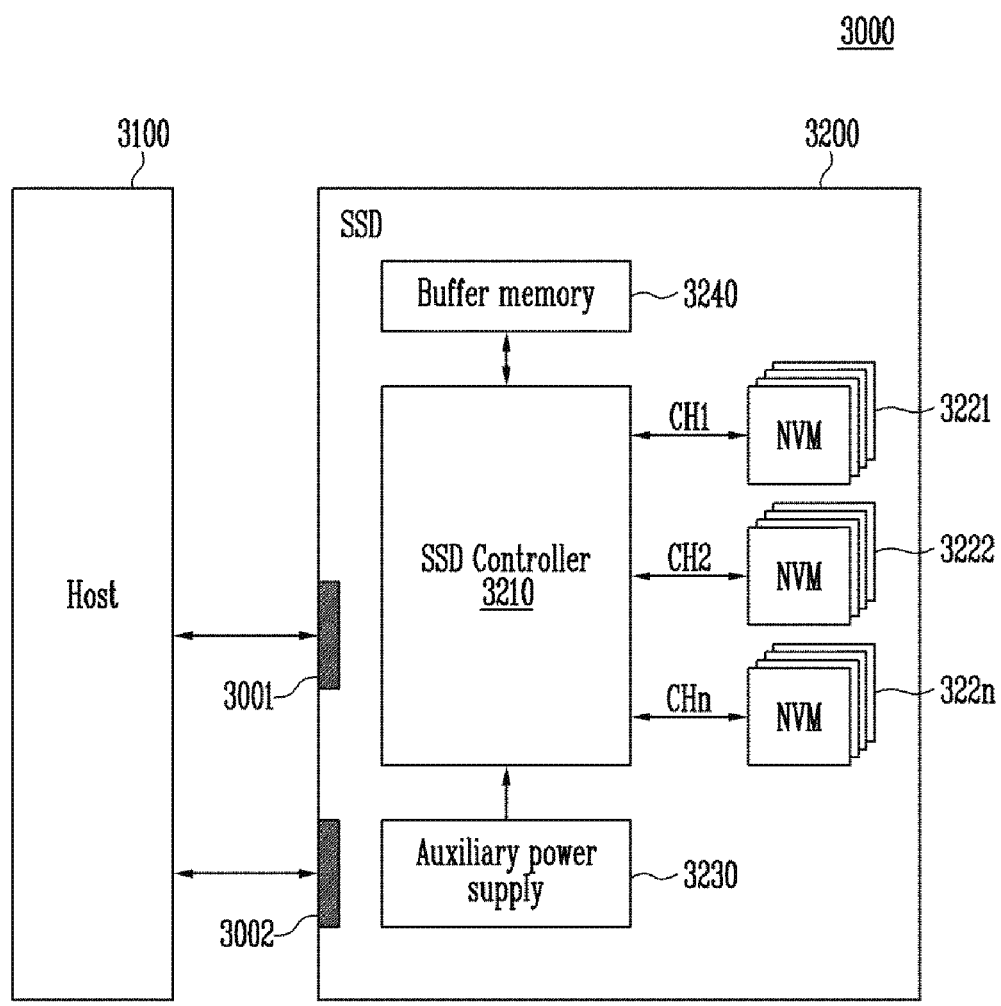
FIG. 19 is a block diagram illustrating a Solid State Drive (SSD) system to which the storage device is applied in accordance with an embodiment of the present disclosure.

FIG. 19 is a block diagram illustrating a Solid State Drive (SSD) system 3000 to which the storage device is applied in accordance with an embodiment of the present disclosure.

Referring to FIG. 19, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store metadata (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 20:
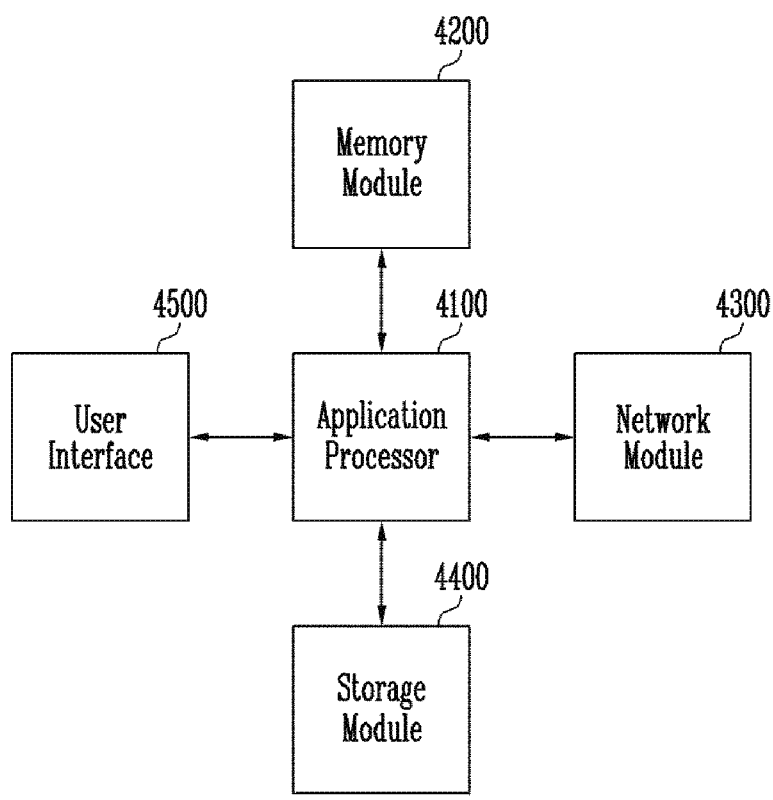
FIG. 20 is a block diagram illustrating a user system to which the storage device is applied in accordance with an embodiment of the present disclosure.

FIG. 20 is a block diagram illustrating a user system 4000 to which the storage device is applied in accordance with an embodiment of the present disclosure.

Referring to FIG. 20, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIGS. 10 to 13. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device configured to process a program operation as fail in a program verify phase so as to prevent UECC fail, and an operating method of the memory device.

While the present disclosure has been shown and described with reference to certain embodiments, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a page including a plurality of memory cells;
   a peripheral circuit configured to perform at least one program loop, wherein the at least one program loop includes:
   a program voltage applying phase for applying, during a program operation, a program voltage to a word line to which the plurality of memory cells are coupled; and
   a program verify phase for determining whether a selected memory cell among the plurality of memory cells has been completely programmed; and
   control logic configured to control the peripheral circuit to:
   perform, during the program verify phase, an auxiliary verify operation of applying an auxiliary verify voltage to the word line;
   perform, during the program verify phase, a main verify operation of applying a main verify voltage larger than the auxiliary verify voltage to the word line; and
   determine whether to interrupt the program operation, based on verify data obtained by performing the auxiliary verify operation and the main verify operation.

2. The memory device of claim 1, wherein the control logic comprises a program loop counter configured to count a number of the at least one program loop.

3. The memory device of claim 2, wherein the control logic further comprises a verify voltage controller configured to control a verify voltage to be applied to the word line during the program verify phase, based on a program loop count value generated by the program loop counter counting the number of the at least one program loop.

4. The memory device of claim 3, wherein, when the program loop count value is less than a reference value, the control logic controls only the main verify operation to be performed during the program verify phase.

5. The memory device of claim 3, wherein, when the program loop count value is equal to or greater than a reference value, the control logic controls the auxiliary verify operation and the main verify operation to be performed during the program verify phase.

6. The memory device of claim 1, wherein the control logic comprises a verify result analyzer configured to count numbers of turned-on memory cells during the auxiliary verify operation and the main verify operation.

7. The memory device of claim 1, wherein the control logic comprises a verify result analyzer configured to count numbers of turned-off memory cells during the auxiliary verify operation and the main verify operation.

8. The memory device of claim 6, wherein, when the counted number of turned-on memory cells during the auxiliary verify operation is smaller than the counted number of turned-on memory cells during the main verify operation, the control logic controls a next program loop to be performed.

9. The memory device of claim 6, wherein, when the counted number of turned-on memory cells during the auxiliary verify operation is greater than or equal to the counted number of turned-on memory cells during the main verify operation, the control logic generates a verify result representing a failure of the program operation.

10. The memory device of claim 6, wherein, when the counted number of turned-on memory cells during the auxiliary verify operation is greater than or equal to the counted number of turned-on memory cells during the main verify operation, the verify result analyzer generates a verify result representing that a failure of the program operation has been determined based on the turned-on memory cells.

11. The memory device of claim 9, wherein the control logic is further configured to store the verify result representing the failure of the program operation in a status register.

12. The memory device of claim 6, wherein, when the counted number of turned-on memory cells during the auxiliary verify operation is greater than or equal to the counted number of turned-on memory cells during the main verify operation, the control logic controls the program loop to stop.

13. A method for operating a memory device including a plurality of pages, the method comprising:
performing at least one program loop including a program voltage applying phase for applying, during a program operation, a program voltage to a word line to which a plurality of memory cells are coupled and a program verify phase for determining whether a selected memory cell among the plurality of memory cells has been completely programmed;
performing, during the program verify phase, an auxiliary verify operation of applying an auxiliary verify voltage to the word line;
performing, during the program verify phase, a main verify operation of applying a main verify voltage larger than the auxiliary verify voltage to the word line; and
determining whether to interrupt the program operation, based on verify data obtained by performing the auxiliary verify operation and the main verify operation.

14. The method of claim 13, further comprising counting a number of the at least one program loop.

15. The method of claim 14, wherein only the main verify operation is performed during the program verify phase when a program loop count value generated by counting the number of the at least one program loop is less than a reference value.

16. The method of claim 14, wherein both the auxiliary verify operation and the main verify operation are performed during the program verify phase when a program loop count value generated by counting the number of the at least one program loop is equal to or greater than a reference value.

17. The method of claim 16, further comprising counting numbers of turned-on memory cells during the auxiliary verify operation and the main verify operation during a verify data analysis phase.

18. The method of claim 17, wherein, during the verify data analysis phase, when the counted number of turned-on memory cells during the auxiliary verify operation is greater than or equal to the counted number of turned-on memory cells during the main verify operation, a verify result representing a failure of the program operation is generated.

19. The method of claim 17, wherein, during the verify data analysis phase, when the counted number of turned-on memory cells during the auxiliary verify operation is greater than or equal to the counted number of turned-on memory cells during the main verify operation, a verify result representing that a failure of the program operation has been determined based on the turned-on memory cells is generated.

20. The method of claim 17, wherein, when the counted number of turned-on memory cells during the auxiliary verify operation is greater than or equal to the counted number of turned-on memory cells during the main verify operation, the program loop is stopped.

* * * * *